(12) United States Patent
Li et al.

(10) Patent No.: US 12,532,129 B2
(45) Date of Patent: Jan. 20, 2026

(54) ACOUSTIC SENSOR AND MANUFACTURING METHOD THEREFOR

(71) Applicant: AAC Technologies Pte. Ltd., Singapore (SG)

(72) Inventors: Chungmin Li, Taiwan (CN); KianHeng Goh, Batu Pahat (MY); Qiang Dan, Shenzhen (CN); Kahkeen Lai, Singapore (SG)

(73) Assignee: AAC Technologies Pte. Ltd., Singapore (SG)

( * ) Notice: Subject to any disclaimer, the term of this patent is extended or adjusted under 35 U.S.C. 154(b) by 166 days.

(21) Appl. No.: 18/613,135

(22) Filed: Mar. 22, 2024

(65) Prior Publication Data
US 2025/0133352 A1    Apr. 24, 2025

Related U.S. Application Data

(63) Continuation of application No. PCT/CN2023/125725, filed on Oct. 20, 2023.

(51) Int. Cl.
*H04R 17/02* (2006.01)
*H04R 7/06* (2006.01)
*H04R 31/00* (2006.01)

(52) U.S. Cl.
CPC ............. *H04R 17/02* (2013.01); *H04R 7/06* (2013.01); *H04R 31/003* (2013.01)

(58) Field of Classification Search
None
See application file for complete search history.

(56) References Cited

U.S. PATENT DOCUMENTS

| | | | |
|---|---|---|---|
| 2021/0067880 A1* | 3/2021 | Cheng | H04R 17/02 |
| 2022/0408196 A1* | 12/2022 | Ohara | H04R 7/06 |
| 2023/0294980 A1* | 9/2023 | Chand | B81C 1/00587 |
| | | | 257/415 |
| 2023/0341282 A1* | 10/2023 | Mawatari | G01L 19/0627 |
| 2023/0349862 A1* | 11/2023 | Zhou | H04R 1/20 |
| 2023/0362550 A1* | 11/2023 | Joke | H04R 7/10 |
| 2024/0284119 A1* | 8/2024 | Goh | H04R 17/005 |
| 2024/0284120 A1* | 8/2024 | Goh | H04R 31/006 |

* cited by examiner

*Primary Examiner* — Walter F Briney, III
(74) *Attorney, Agent, or Firm* — Wiersch Law Group

(57) ABSTRACT

Acoustic sensor and manufacturing method. The acoustic sensor includes: a base including a first silicon layer, a first oxide layer and a second silicon layer stacked, and a back cavity; a second oxide layer formed on the base; a piezoelectric unit formed on the second oxide layer and including a first electrode layer, a piezoelectric layer and a second electrode layer stacked; a first slit formed at a middle portion of the second electrode layer and passing the second electrode layer, the piezoelectric layer and the first electrode layer; a second slit formed at a middle portion of the second silicon layer and passing the second silicon layer and the second oxide layer; an additional membrane filled in the first slit and not filled in the second slit. The SPL and structural reliability are effectively improved, and the material type is not limited by dry film type materials.

10 Claims, 3 Drawing Sheets

ACOUSTIC SENSOR AND MANUFACTURING METHOD THEREFOR

CROSS-REFERENCE TO RELATED APPLICATIONS

This application is a continuation of International Application No. PCT/CN2023/125725, filed on Oct. 20, 2023, which is hereby incorporated by reference in its entirety.

TECHNICAL FIELD

The present disclosure relates to the field of semiconductor technology, in particular to an acoustic sensor and a manufacturing method therefor.

BACKGROUND

Typical acoustic sensors utilize liquid or paste polymer to produce an additional membrane on a piezoelectric unit using a spin coating method. The polymer fully fills into accessible spaces on the pattern structure. However, the fully filled polymer may limit vibrational displacement and performance.

To avoid structural gap filling, a dry film type material is used to cover the structure without filling the structural gap. However, the manufacturing difficulties and handling concerns are much higher than liquid/paste type materials.

SUMMARY

The purpose of the present disclosure is to provide an acoustic sensor and a manufacturing method therefor, to solve the technical problems in the prior art.

In an aspect, an embodiment of the present disclosure provides an acoustic sensor, including: a base including a first silicon layer, a first oxide layer, and a second silicon layer that are stacked in sequence from bottom to top, a back cavity being formed in the base, the back cavity passing through the first silicon layer and the first oxide layer in sequence, and the second silicon layer being exposed by the back cavity; a second oxide layer formed on the base; a piezoelectric unit formed on the second oxide layer and including a first electrode layer, a piezoelectric layer and a second electrode layer that are stacked in sequence from bottom to top; a first slit formed at a middle portion of the second electrode layer and passing through the second electrode layer, the piezoelectric layer and the first electrode layer in sequence; a second slit formed at a middle portion of the second silicon layer and passing through the second silicon layer and the second oxide layer in sequence; an opening formed at an edge of the second electrode layer and passing through the second electrode layer and the piezoelectric layer in sequence, part of the first electrode layer being exposed by the opening; an additional membrane covering the second electrode layer and part of the opening, the additional membrane being filled in the first slit and not filled in the second slit.

As an improvement, the additional membrane includes a first section, a second section and a third section; and the first section is filled in the first slit, the second section is laminated on the second electrode layer, and the third section is laminated on the first electrode layer in the opening.

As an improvement, a first metal pad is laminated on the first electrode layer located at the opening, the first metal pad is electrically connected to the first electrode layer, and a position of the first metal pad is offset from a position of the third section.

As an improvement, a second metal pad is laminated on the second electrode layer, the second metal pad is electrically connected to the second electrode layer, the second section wraps the second metal pad, a through-slot passing through the second section is formed in the second section, a position of the second metal pad corresponds to a position of the through-slot, and the second metal pad is exposed by the through-slot.

As an improvement, an axis of the first slit coincides with an axis of the second slit.

In another aspect, an embodiment of the present disclosure provides a manufacturing method for an acoustic sensor, including: providing a base, the base including a first silicon layer, a first oxide layer and a second silicon layer that are stacked in sequence from bottom to top; depositing in sequence from bottom to top on the top of the second silicon layer to form a second oxide layer, a first electrode layer, a piezoelectric layer and a second electrode layer; forming a first slit at a middle portion of the second electrode layer and forming an opening at an edge of the second electrode layer by etching, the first slit passing through the second electrode layer, the piezoelectric layer and the first electrode layer in sequence, the opening passing through the second electrode layer and the piezoelectric layer in sequence, and part of the first electrode layer being exposed by the opening; forming a first metal pad on the first electrode layer at the opening; forming a second metal pad on the second electrode layer at the opening; forming an additional membrane including a first section, a second section and a third section, the first section being deposited in the first slit, the second section being deposited on the second electrode layer and wrapping the second metal pad, a through-slot passing through the second section being formed in the second section, a position of the second metal pad corresponding to a position of the through-slot, the second metal pad being exposed by the through-slot, the third section being deposited in the opening, and a position of the third section being offset from a position of the first metal pad; forming a pre-formation cavity at a bottom of the first silicon layer by etching; forming a back cavity at the bottom of the first silicon layer by etching, the back cavity passing through the first silicon layer and the first oxide layer in sequence, and the second silicon layer being exposed by the back cavity; and forming a second slit at a bottom of the second silicon layer by etching, the second slit passing through the second silicon layer and the second oxide layer in sequence.

As an improvement, axes of the pre-formation cavity, the first slit and the second slit coincide with each other.

As an improvement, the additional membrane is formed by vapor deposition, photolithography, roll pressing or hot pressing.

As an improvement, the vapor deposition includes physical vapor deposition or chemical vapor deposition.

As an improvement, the piezoelectric layer is made of lead zirconium titanate, aluminum nitride, barium titanate or a mixture of thereof.

Compared with the prior arts, the additional membrane 40 in the present disclosure is filled only in the first slit of the piezoelectric unit and not filled in the second slit of the base and not filled in the back cavity. Compared with the typical fully-filled liquid type, the piezoelectric unit vibrates with maximum displacement and minimum restriction, and the sound pressure can be increased higher, the SPL and structural reliability can be effectively improved, and the material type is no longer limited by dry film type materials.

REFERENCE SIGNS

10—base; 11—back cavity; 12—first silicon layer; 13—first oxide layer; 14—second silicon layer; 15—pre-formation cavity; 16—second slit;
20—second oxide layer;
30—piezoelectric unit; 31—first electrode layer; 32—piezoelectric layer; 33—second electrode layer; 34—opening; 35—first slit;
40—Additional membrane; 41—first section; 42—second section; 43—third section;
50—first metal pad;
60—second metal pad.

DESCRIPTION OF EMBODIMENTS

The embodiments described below with reference to the figures are exemplary and are only used to explain the present disclosure and cannot be construed as limiting the present disclosure.

Figure 1:
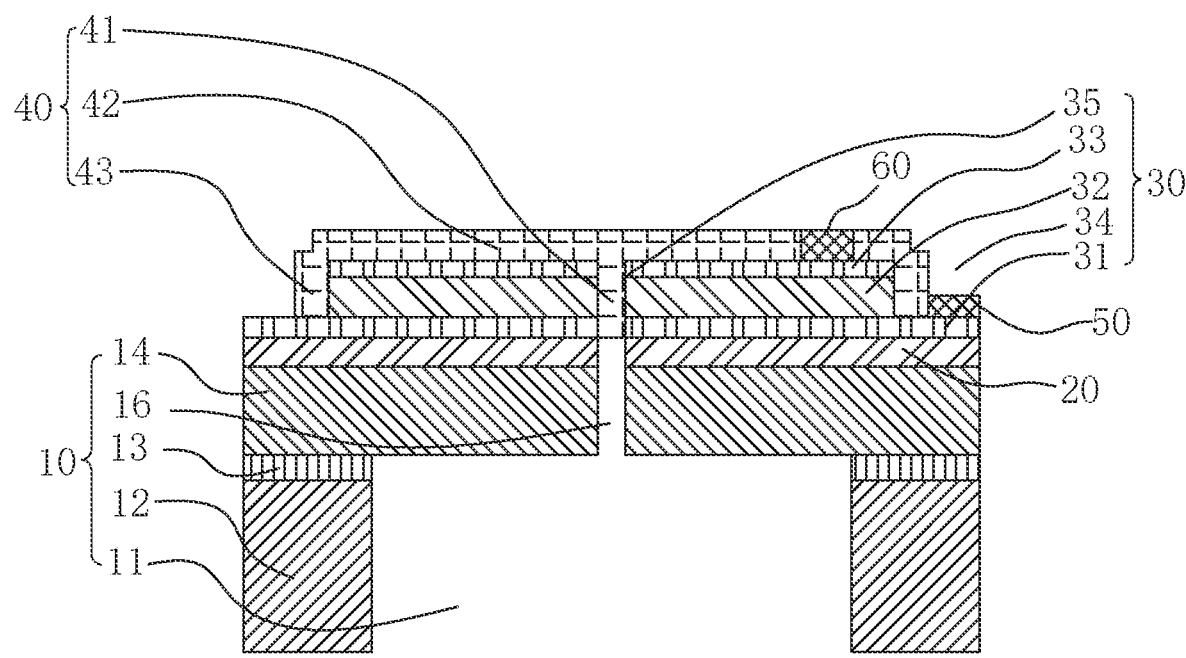
FIG. 1 is a schematic cross-sectional view of an acoustic sensor according to some embodiments of the present disclosure.

FIG. 1 is a schematic cross-sectional view of an acoustic sensor according to an embodiment of the present disclosure. As shown in FIG. 1, an embodiment of the present disclosure provides an acoustic sensor, including a base 10, a second oxide layer 20, a piezoelectric unit 30, an additional membrane 40, a first metal pad 50 and a second metal pad 60.

The base 10 includes a first silicon layer 12, a first oxide layer 13 and a second silicon layer 14 that are stacked in sequence from bottom to top. A back cavity 11 is formed in the base 10. In an embodiment, an inner contour of the back cavity 11 is a circular groove structure. The back cavity 11 passes through the first silicon layer 12 and the first oxide layer 13 in sequence. The second silicon layer 14 is exposed by the back cavity 11. In a feasible implementation, the first oxide layer 13 made of $SiO_2$ is formed on the first silicon layer 12 made of silicon by using a vapor deposition method, a thermal oxidation method or a thermal decomposition method. The second silicon layer 14 is formed on the first oxide layer 13 using a vapor deposition method, a thermal oxidation method or a thermal decomposition method. The material of the second silicon layer 14 may be the same as the material of the first silicon layer 12. The first oxide layer 13 is located under the second silicon layer 14 and has a significantly lower etching rate than the second silicon layer 14. When etching to form the slit or back cavity 11, it allows the etching to stop relatively uniformly at the interface between the first oxide layer 13 and the second silicon layer 14.

The second oxide layer 20 is formed on the base 10, and a layer of the second oxide layer 20 can be sputtered and grown on the surface of the second silicon layer 14 through magnetron sputtering.

The piezoelectric unit 30 is formed on the base 10. The piezoelectric unit 30 includes a first electrode layer 31, a piezoelectric layer 32 and a second electrode layer 33 that are stacked in sequence from bottom to top.

The first electrode layer 31 is formed on the second oxide layer 20 by electron beam lift-off or magnetron sputtering, and is patterned using a photolithography process. The first electrode layer 31 is connected to a bottom electrode welding-pad (not shown) through a bottom electrode lead (not shown). The material of the first electrode layer 31 may be one or more of Al, Mo, W, Pt, Cu, Ag, Au, ZrN, or other materials with good electrical conductivity. In a feasible implementation, the first electrode layer 31 is made of molybdenum (Mo).

The piezoelectric layer 32 is deposited on the first electrode layer 31. The piezoelectric layer 32 has the characteristics of mechanical vibration in the presence of an electric field and the generation of an electric field if the mechanical vibration occurs. The piezoelectric layer 32 can be made of lead zirconium titanate, aluminum nitride or barium titanate or any other piezoelectric material. In a feasible implementation, the piezoelectric layer 32 is made of aluminum nitride.

The second electrode layer 33 is formed on the piezoelectric layer 32 by electron beam lift-off or magnetron sputtering, and is patterned using a photolithography process. The second electrode layer 33 is connected to a top electrode welding-pad (not shown) through a top electrode lead (not shown). The material of the second electrode layer 33 may be one or more of Al, Mo, W, Pt, Cu, Ag, Au, ZrN, or other materials with good electrical conductivity. In a feasible implementation, the second electrode layer 33 is made of molybdenum (Mo).

A first slit 35 and an opening 34 are formed in the piezoelectric unit 30, and the first slit 35 is formed at a middle portion of the second electrode layer 33. In an embodiment, an inner contour of the first slit 35 is a circular groove structure. An axis of the first slit 35 coincides with an axis of the back cavity 11. The first slit 35 passes through the second electrode layer 33, the piezoelectric layer 32 and the first electrode layer 31 in sequence. The opening 34 is formed at an edge of the second electrode layer 33. In an embodiment, the opening 34 is an annular groove structure. The opening 34 passes through the second electrode layer 33 and the piezoelectric layer 32 in sequence. Part of the first electrode layer 31 is exposed by the opening 34.

The second slit 16 is formed in the base 10. The second slit 16 is formed at a middle portion of the second silicon layer 14. The second slit 16 passes through the second silicon layer 14 and the second oxide layer 20 in sequence. In an embodiment, an inner contour of the second slit 16 is a circular groove structure. An axis of the second slit 16 coincides with an axis of the first slit 35. An end of the second slit 16 is connected to the first slit 35, and another end of the second slit 16 is connected to the back cavity 11.

An additional membrane 40 is formed to cover the second electrode layer 33 and part of the opening 34. The additional membrane 40 is filled in the first slit 35 and not filled in the second slit 16. Compared with the typical fully-filled liquid type, the piezoelectric unit 30 vibrates with maximum displacement and minimum restriction, and the sound pressure can be increased higher, the SPL and structural reliability can be effectively improved, and the material type is no longer limited by dry film type materials.

A first metal pad 50 is stacked on the first electrode layer 31 at the opening 34 to be electrically connected to the first layer electrode 31. In an embodiment of the present disclosure, a patterned hard mask is made on the second electrode layer 33, an opening 34 is formed at an edge of the second electrode layer 33 by dry etching or wet etching to expose part of the first electrode layer 31, and the first metal pad 50 is deposited on the first electrode layer 31 to form an electrical connection. The second metal pad 60 is stacked on the second electrode layer 33 to be electrically connected to the second electrode layer 33.

In an embodiment of the present disclosure, the additional membrane 40 includes a first section 41, a second section 42 and a third section 43. In an embodiment, the first section 41, the second section 42 and the third section 43 are integrally formed to facilitate the forming process and improve the structural stability. The second section 42 is located at an outer edge of the first section 41. The third section 43 is located at an outer edge of the second section 42. The first section 41 is filled in the first slit 35. The second section 42 is deposited on the second electrode layer 33. The second section 42 wraps the second metal pad 60. A through-slot passing through the second section 42 is formed in the second section 42. A position of the second metal pad 60 corresponds to a position of the through-slot. The second metal pad 60 is exposed by the through-slot. The third section 43 is deposited on the first electrode layer 31 of the opening 34. The position of the first metal pad 50 is offset from the position of the third section 43.

By filling the first slit 35 with the first section 41 of the additional membrane 40, the sound pressure loss due to air leakage caused by the first slit 35 is reduced. The additional membrane 40 has certain tensile deformation properties. When the piezoelectric unit 30 vibrates, the additional membrane 40 performs bending deformation, thereby reducing restrictions on the movement of the piezoelectric unit 30. In an embodiment of the present disclosure, the additional membrane 40 is made of parylene. The additional membrane 40 is formed by vapor deposition. The vapor deposition may be physical vapor deposition or chemical vapor deposition. The chemical vapor deposition (CVD) uses gaseous or vaporous parylene to react on the second electrode layer 33 and the metal pad to form a membrane. The physical vapor deposition (PVD) uses a physical method (such as evaporation, sputtering, etc.) to vaporize parylene and then deposit it on a surface of the second electrode layer 33 and the metal pad to form a membrane. Both methods can achieve a membrane with good thickness uniformity.

The additional membrane 40 is not filled in the second slit 16, thereby making the deformation of the additional membrane 40 more compliant. The restriction on the movement of the piezoelectric unit 30 is reduced. When the piezoelectric unit 30 performs bending deformation, a periphery of the piezoelectric unit 30 will not be subject to excessive restrictions, further improving SPL and structural reliability. In an embodiment of the present disclosure, the first section 41, the second section 42 and the third section 43 have a same thickness; the first section 41, the second section 42 and the third section 43 each have a consistent thickness thereof; the additional membrane 40 has evenly distributed thickness on a surface of the piezoelectric unit 30, thereby being suitable for an acoustic sensor having a large area. The deformation of the piezoelectric unit 30 follows a regular parabolic shape, the restriction of local deformation of the piezoelectric unit 30 due to the addition of the additional membrane 40 is avoided, thereby improving the reliability of the acoustic sensor.

FIGS. 2a-2e are flow charts of a manufacturing method for an acoustic sensor according to some embodiments of the present disclosure. The manufacturing method includes the following steps.

Figure 2A:
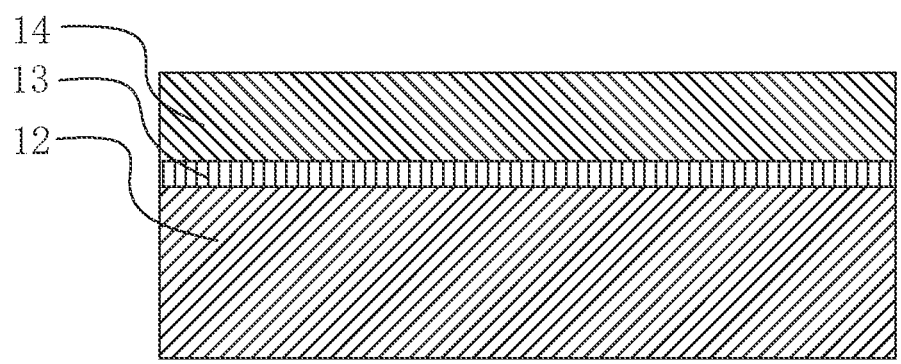
FIGS. 2a-2e are flow charts of a manufacturing method for an acoustic sensor according to some embodiments of the present disclosure.

As shown in FIG. 2a, a base 10 is provided. According to an embodiment of the present disclosure, a first silicon layer 12 is provided, and a first oxide layer 13 made of $SiO_2$ is formed on the first silicon layer 12 made of silicon using a vapor deposition method, a thermal oxidation method or a thermal decomposition method. The second silicon layer 14 is formed on the first oxide layer 13 using methods such as vapor deposition, thermal oxidation or thermal decomposition. The second silicon layer 14 and the first silicon layer 12 may be made of a same material.

Figure 2B:
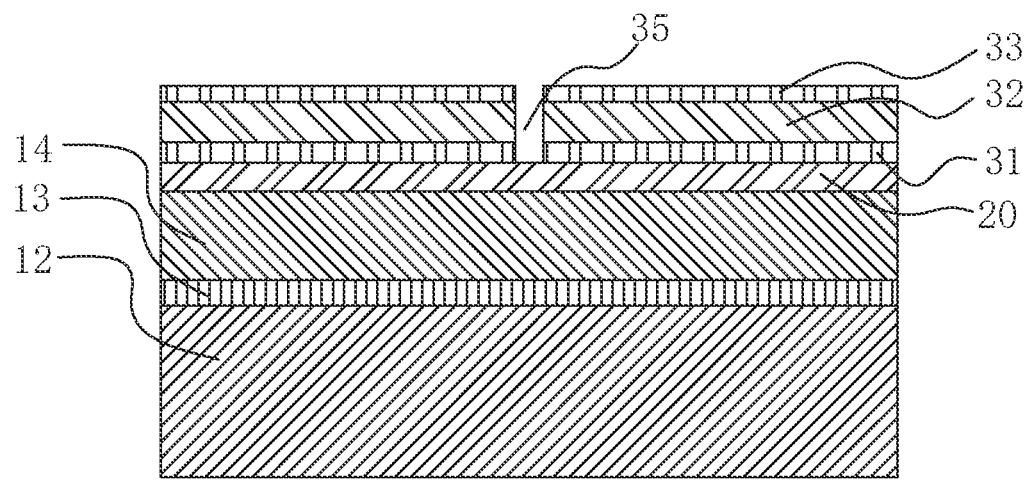

As shown in FIG. 2b, a second oxide layer 20 is formed on the second silicon layer 14. According to an embodiment of the present disclosure, a layer of second oxide layer 20 is sputtered and grown on a surface of the second silicon layer 14 by magnetron sputtering.

With further reference to FIG. 2b, a first electrode layer 31, a piezoelectric layer 32 and a second electrode layer 33 are deposited over the second oxide layer 20 in sequence from bottom to top. The first electrode layer 31 is formed on the second oxide layer 20 by electron beam lift-off or magnetron sputtering, and is patterned using a photolithography process. The first electrode layer 31 is connected to a bottom electrode welding-pad through a bottom electrode lead. The piezoelectric layer 32 is deposited on the first electrode layer 31. The second electrode layer 33 is formed on the piezoelectric layer 32 by electron beam lift-off or magnetron sputtering, and is patterned using a photolithography process. The second electrode layer 33 is connected to a top electrode welding-pad through a top electrode lead.

Figure 2C:
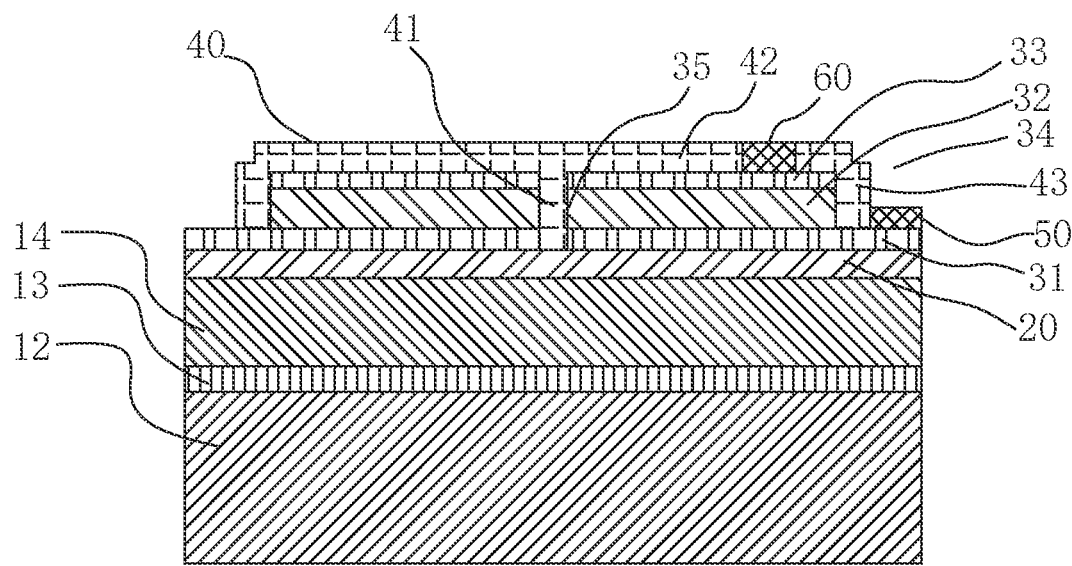

As shown in FIG. 2c, a first slit 35 is formed by etching at a middle portion of the second electrode layer 33, and an opening 34 is formed by etching at an edge of the second electrode layer 33. The first slit 35 passes through the second electrode layer 33, the piezoelectric layer 32 and the first electrode layer 31 in sequence. The opening 34 passes through the second electrode layer 33 and the piezoelectric layer 32 in sequence. The first electrode layer 31 is exposed by the opening 34. According to an embodiment of the present disclosure, the first slit 35 is formed at a middle portion of the second electrode layer 33 by dry etching or wet etching, and the opening 34 is formed by etching at an edge of the second electrode layer 33.

As shown in FIG. 2c, a first metal pad 50 is deposited on the first electrode layer 31 at the opening 34. According to an embodiment of the present disclosure, the first metal pad 50 is deposited on the first electrode layer 31 by electron beam lift-off or magnetron sputtering to form an electrical connection.

A second metal pad 60 is formed on the second electrode layer 33. According to an embodiment of the present disclosure, the second metal pad 60 is deposited on the second electrode layer 33 by electron beam lift-off or magnetron sputtering to form an electrical connection.

With further reference to FIG. 2c, the additional membrane 40 is formed by a vapor deposition method. A first section 41 of the additional membrane 40 is filled in the first slit 35. A second section 42 of the additional membrane 40 is deposited on the second electrode layer 33 and wraps the second metal pad 60. The second section 42 is formed with a through-slot passing through the second section 42. The position of the second metal pad 60 corresponds to the position of the through-slot. The second metal pad 60 is exposed by the through-slot. The third section 43 is deposited in the opening 34, and the position of the third section 43 is offset from the position of the first metal pad 50.

In a feasible implementation, the additional membrane 40 is made of parylene, and the vapor deposition may be physical vapor deposition or chemical vapor deposition, both of which can achieve excellent deposition effects. In a feasible implementation, the additional membrane 40 is made of polyparaxylene. The chemical vapor deposition (CVD) uses gaseous or vaporous polyparaxylene to react on a top surface of the second electrode layer 33, a top surface of the metal pad and an inner side of the slit to form a membrane. The physical vapor deposition (PVD) uses a physical method (such as evaporation, sputtering, etc.) to vaporize parylene and deposit it on a top surface of the second electrode layer 33, a top surface of the metal pad and an inner surface of the slit to form a membrane.

Figure 2D:
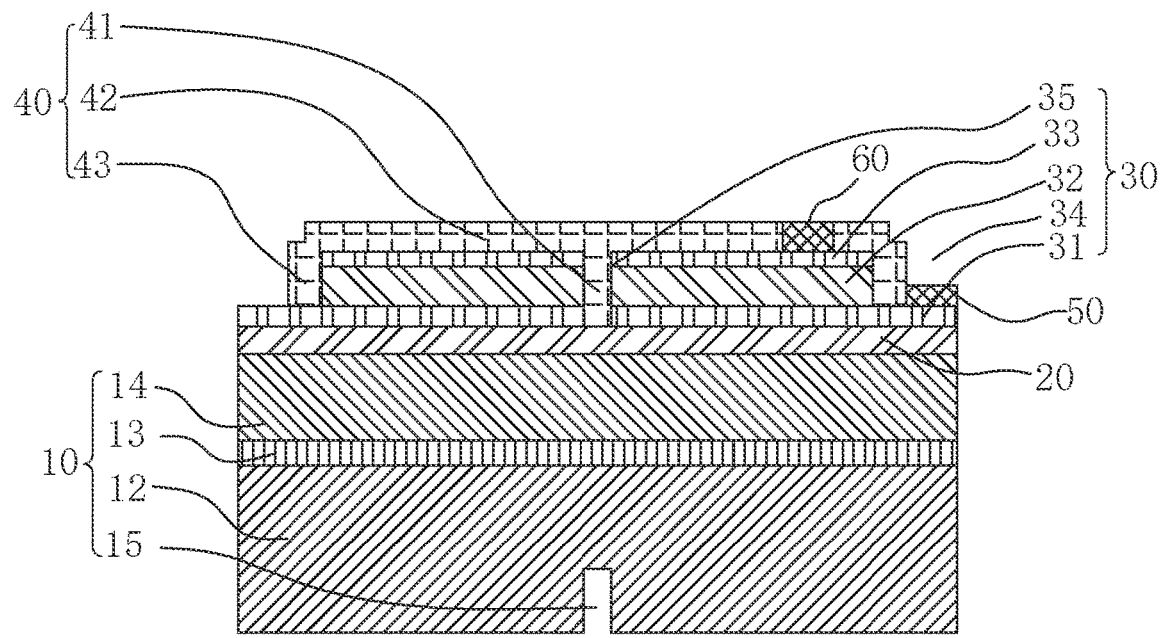
Figure 2E:
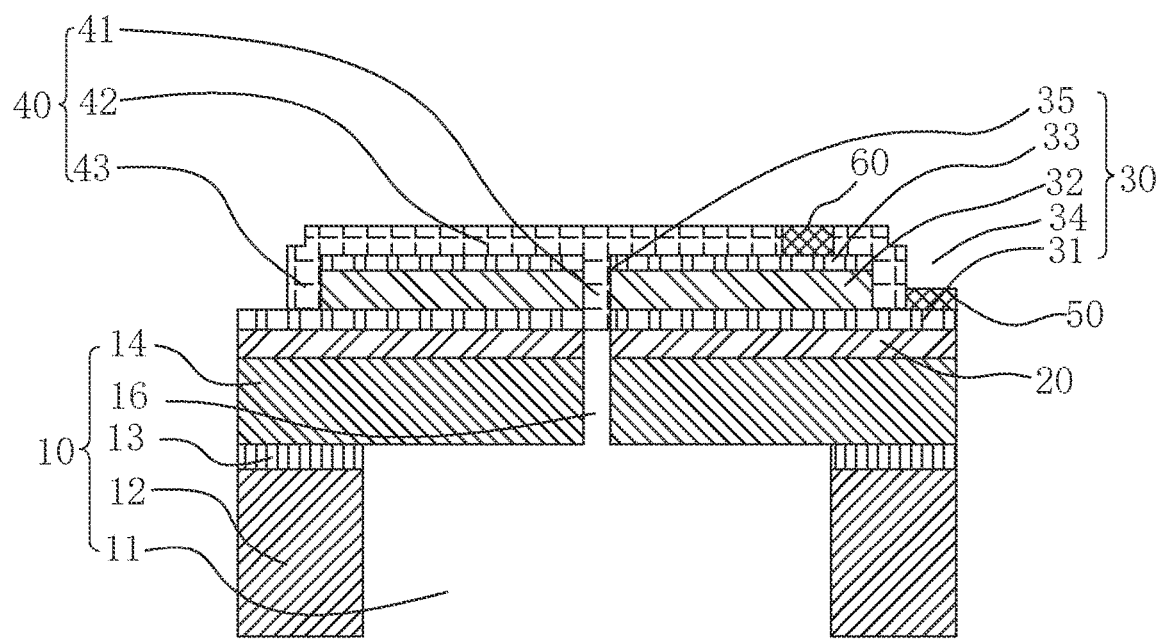

As shown in FIG. 2d, a pre-formation cavity 15 is formed at the bottom of the first silicon layer 12 by etching. According to an embodiment of the present disclosure, the pre-formation cavity 15 is formed at a middle portion of the first silicon layer 12 by dry etching or wet etching.

As shown in FIG. 2f, a back cavity 11 is formed at the bottom of the first silicon layer 12 by etching. The back cavity 11 passes through the first silicon layer 12 and the first oxide layer 13 in sequence. The second silicon layer 14 is exposed by the back cavity 11. According to an embodiment of the present disclosure, the back cavity 11 is formed at the bottom of the first silicon layer 12 by dry etching or wet etching, and the back cavity 11 passes through the first silicon layer 12 and the first oxide layer 13 in sequence. The second slit 16 is formed at the bottom of the second silicon layer 14 by etching, and the second slit 16 passes through the second silicon layer 14 and the second oxide layer 20 in sequence.

For the acoustic sensor manufactured by the manufacturing method described above, the additional membrane 40 is filled only in the first slit 35 of the piezoelectric unit 30 and not filled in the second slit 16 of the base 10 and not filled in the back cavity 11. Compared with the typical fully-filled liquid type, the piezoelectric unit 30 vibrates with maximum displacement and minimum restriction, and the sound pressure can be increased higher, the SPL and structural reliability can be effectively improved, and the material type is no longer limited by dry film type materials.

The structures, features and effects of the present disclosure have been described in detail in the embodiments shown in the figures. It should be noted that the above descriptions are merely some preferred embodiments of the present disclosure, and a scope of the present disclosure is not limited by the figures. Any changes made to the concept of the present disclosure, or modifications to equivalent embodiments with equivalent changes, shall be within a scope of the present disclosure as long as they do not exceed the spirit covered by the description and figures.

What is claimed is:

1. An acoustic sensor, comprising:
a base comprising a first silicon layer, a first oxide layer, and a second silicon layer that are stacked in sequence from bottom to top, wherein a back cavity is formed in the base, the back cavity passes through the first silicon layer and the first oxide layer in sequence, and the second silicon layer is exposed by the back cavity;
a second oxide layer formed on the base;
a piezoelectric unit formed on the second oxide layer and comprising a first electrode layer, a piezoelectric layer and a second electrode layer that are stacked in sequence from bottom to top;
a first slit formed at a middle portion of the second electrode layer and passing through the second electrode layer, the piezoelectric layer and the first electrode layer in sequence;
a second slit formed at a middle portion of the second silicon layer and passing through the second silicon layer and the second oxide layer in sequence;
an opening formed at an edge of the second electrode layer and passing through the second electrode layer and the piezoelectric layer in sequence, wherein part of the first electrode layer is exposed by the opening;
an additional membrane covering the second electrode layer and part of the opening, wherein the additional membrane is filled in the first slit and not filled in the second slit.

2. The acoustic sensor as described in claim 1, wherein the additional membrane comprises a first section, a second section and a third section; and
wherein the first section is filled in the first slit, the second section is laminated on the second electrode layer, and the third section is laminated on the first electrode layer in the opening.

3. The acoustic sensor as described in claim 2, wherein a first metal pad is laminated on the first electrode layer located at the opening, the first metal pad is electrically connected to the first electrode layer, and a position of the first metal pad is offset from a position of the third section.

4. The acoustic sensor as described in claim 2, wherein a second metal pad is laminated on the second electrode layer, the second metal pad is electrically connected to the second electrode layer, the second section wraps the second metal pad, a through-slot passing through the second section is formed in the second section, a position of the second metal pad corresponds to a position of the through-slot, and the second metal pad is exposed by the through-slot.

5. The acoustic sensor as described in claim 1, wherein an axis of the first slit coincides with an axis of the second slit.

6. A manufacturing method for an acoustic sensor, comprising:
providing a base, the base comprising a first silicon layer, a first oxide layer and a second silicon layer that are stacked in sequence from bottom to top;
depositing in sequence from bottom to top on the top of the second silicon layer to form a second oxide layer, a first electrode layer, a piezoelectric layer and a second electrode layer;
forming a first slit at a middle portion of the second electrode layer and forming an opening at an edge of the second electrode layer by etching, wherein the first slit passes through the second electrode layer, the piezoelectric layer and the first electrode layer in sequence, the opening passes through the second electrode layer and the piezoelectric layer in sequence, and part of the first electrode layer is exposed by the opening;
forming a first metal pad on the first electrode layer at the opening;
forming a second metal pad on the second electrode layer at the opening;
forming an additional membrane, wherein the additional membrane comprises a first section, a second section and a third section, the first section is deposited in the first slit, the second section is deposited on the second electrode layer and wraps the second metal pad, a through-slot passing through the second section is formed in the second section, a position of the second metal pad corresponds to a position of the through-slot, the second metal pad is exposed by the through-slot, the third section is deposited in the opening, and a position of the third section is offset from a position of the first metal pad;

forming a pre-formation cavity at a bottom of the first silicon layer by etching;

forming a back cavity at the bottom of the first silicon layer by etching, wherein the back cavity passes through the first silicon layer and the first oxide layer in sequence, and the second silicon layer is exposed by the back cavity; and forming a second slit at a bottom of the second silicon layer by etching, wherein the second slit passes through the second silicon layer and the second oxide layer in sequence.

7. The manufacturing method as described in claim 6, wherein axes of the pre-formation cavity, the first slit and the second slit coincide with each other.

8. The manufacturing method as described in claim 6, wherein the additional membrane is formed by vapor deposition, photolithography, roll pressing or hot pressing.

9. The manufacturing method as described in claim 8, wherein the vapor deposition comprises physical vapor deposition or chemical vapor deposition.

10. The manufacturing method as described in claim 6, wherein the piezoelectric layer is made of lead zirconium titanate, aluminum nitride, barium titanate or a mixture of thereof.

* * * * *